(12) United States Patent
Tseng et al.

(10) Patent No.: US 12,272,653 B2
(45) Date of Patent: Apr. 8, 2025

(54) SEMICONDUCTOR PACKAGING SUBSTRATE AND MANUFACTURING METHOD THEREOF

(71) Applicant: PHOENIX PIONEER TECHNOLOGY CO., LTD., Hsinchu County (TW)

(72) Inventors: Chao-Tsung Tseng, Hsinchu County (TW); Che-Wei Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 127 days.

(21) Appl. No.: 17/988,798

(22) Filed: Nov. 17, 2022

(65) Prior Publication Data
US 2023/0154861 A1  May 18, 2023

(30) Foreign Application Priority Data
Nov. 18, 2021  (TW) .................................. 110142971

(51) Int. Cl.
*H01L 23/50* (2006.01)
*H01L 21/48* (2006.01)
*H01L 23/498* (2006.01)
*H01L 23/544* (2006.01)

(52) U.S. Cl.
CPC ........ *H01L 23/544* (2013.01); *H01L 21/4857* (2013.01); *H01L 23/49822* (2013.01); *H01L 2223/54426* (2013.01)

(58) Field of Classification Search
CPC ... H01L 23/544; H05K 3/0008; H05K 3/4638
See application file for complete search history.

(56) References Cited

U.S. PATENT DOCUMENTS

2012/0061732 A1\* 3/2012 Hirai ................... H10N 70/063
257/E27.07

\* cited by examiner

*Primary Examiner* — Jeremy C Norris
(74) *Attorney, Agent, or Firm* — WPAT, PC

(57) ABSTRACT

A semiconductor packaging substrate is provided, which includes a build-up circuit structure, at least one fiducial marker structure, and an insulating protective layer. The fiducial marker structure includes a fiducial marker and a second insulating layer covering the fiducial marker. The second insulating layer is made of a transparent insulation material, so that the fiducial marker inside the second insulating layer can be seen through a CCD lens or tool maker microscope for alignment so as to easily create a smaller see-through area and the process parameters can be easily controlled. Besides, the disclosure further provides a manufacturing method for the semiconductor packaging substrate.

10 Claims, 5 Drawing Sheets

SEMICONDUCTOR PACKAGING SUBSTRATE AND MANUFACTURING METHOD THEREOF

CROSS REFERENCE TO RELATED APPLICATION

All related applications are incorporated by reference. The present application is based on, and claims priority from, Taiwan Application Serial Number 110142971, filed on Nov. 18, 2021, the disclosure of which is hereby incorporated by reference herein in its entirety.

TECHNICAL FIELD

The present disclosure relates in general to a semiconductor packaging substrate, in particular to a semiconductor packaging substrate containing a fiducial marker and the manufacturing method thereof.

BACKGROUND

The application of the semiconductor packaging substrate product includes various electronic products, such as microprocessors, automotive electronics, image processors, and radio frequency identification (RFID). The fiducial marker of the semiconductor packaging substrate is used for alignment in the subsequent semiconductor packaging process. The inner fiducial marker of the semiconductor packaging substrate needs to be exposed and by such, the packaging machine can complete the alignment.

FIG. 1 shows a conventional fiducial marker structure with an opening of a solder mask protective film. As shown in FIG. 1, an IC packaging substrate 10 has a build-up circuit substrate 12, a fiducial marker 14 and a solder mask protective film 16. The build-up circuit substrate 12 has a conductive circuit 20 and a dielectric layer 22. The solder mask protective film 16 is a photosensitive solder mask protective film. In order to reveal the fiducial marker 14, an opening 18 needs to be developed at the solder mask protective film 16 to expose the fiducial marker 14.

If the above-mentioned solder mask protective film adopts the fiducial marker structure, the solder mask protective film can only be very thin. If the solder mask protective film is too thick, it will affect the design of the opening. In addition, the packaging machine will also be affected by the level difference and the unevenness of the notch, which will result in the packaging substrate crack.

Another conventional fiducial marker structure with mechanical opening, as shown in FIG. 2, wherein an IC packaging substrate 30 has a build-up circuit substrate 32 and a fiducial marker 34. The build-up circuit substrate 32 includes a conductive circuit 40, an upper dielectric layer 42 and a lower dielectric layer 44. To reveal the fiducial marker 34, an opening 38 needs to be made mechanically at the upper dielectric layer 42 to expose the fiducial marker 34.

To use the fiducial marker structure of the above-mentioned mechanical opening, the opening substrate has to be used, then use glue material and glue film to be fixed on the substrate, then use punch, milling cutter or laser to form an opening at the dielectric layer. However, the depth and range of the opening are limited, it is not allowed to make designs that are too deep, large or too small; in addition, the punch or mechanical milling cutter will cause a larger R angle because of their shape-forming factor, so, it is necessary to increase the opening size to avoid the R angle. Therefore, the scopes of the use of these methods are limited, and alternatively, the heat generated by the laser will harden the film, thus regardless whether the opening is obtained mechanically or by laser, it is easy to cause problems such as offset, deformation, glue leaking, contamination, deterioration or chipping during lamination process.

FIG. 3 shows another conventional fiducial marker structure. As shown in FIG. 3, an IC packaging substrate 60 includes a build-up circuit substrate 62 and a fiducial marker copper pillar 64. The build-up circuit substrate 62 includes a conductive circuit 70, an upper dielectric layer 72 and a lower dielectric layer 74. To make the fiducial marker copper pillars 64, it needs to add multiple processes, such as: defining the required fiducial marker position by yellow light lithography, electroplating the fiducial marker copper pillars 64, removing the dry film photoresist, introducing the dielectric layer 72 and grinding the upper dielectric layer 72 to reveal to the fiducial marker copper pillars 64. Because the end surface of the fiducial marker copper pillar 64 is exposed, it is easy to get oxidized or contaminated, which will therefore affect the recognition performance of the CCD lens/tool maker microscope and result in misjudgment.

SUMMARY

The object of the present disclosure is to provide a semiconductor packaging substrate and a manufacturing method thereof, so that, for example, a CCD lens or a tool maker microscope can be used to perform perspective and alignment when the fiducial marker structure of the present disclosure is applied. Furthermore, the method of the present disclosure can make a small see-through area easily, and the process parameters of the method can be easily controlled.

In order to achieve the above objects, the present disclosure provides a semiconductor packaging substrate in an embodiment, which includes a build-up circuit structure, a fiducial marker structure and an insulating protective layer. The build-up circuit structure includes a first insulating layer and a build-up circuit. The fiducial marker structure is disposed on the build-up circuit structure, and includes a fiducial marker and a transparent second insulating layer. The insulating protective layer covers a surface of the build-up circuit structure and the fiducial marker structure. The top surface of the transparent second insulating layer of the fiducial marker structure is exposed on the insulating protective layer, so that the user can see through the fiducial marker structure and align to the fiducial marker disposed therein by using, for example, a CCD lens or a tool maker microscope.

In another embodiment of the present disclosure, the insulating protective layer is further provided with a plurality of openings to expose a part of the build-up circuit as an external electrical connection pad.

The present disclosure provides, in one embodiment, a method for manufacturing a semiconductor packaging substrate, which includes the following steps: providing a substrate; forming a build-up circuit structure on the substrate including a build-up circuit and a first insulating layer by a build-up process, and simultaneously forming at least one fiducial marker made of metallic material when the build-up circuit is formed; forming a transparent second insulating layer on the fiducial marker by photolithography technology to completely cover the fiducial marker; the transparent second insulating layer and the fiducial marker constitute the fiducial marker structure; forming an insulating protective layer on the build-up circuit structure to cover the fiducial marker structure and a surface of the build-up circuit structure; removing a part of the insulating protective layer to expose the top surface of the transparent second insulating layer; and removing the substrate to expose a part of the surface of the build-up circuit.

In another embodiment of the present disclosure, a method for manufacturing a semiconductor packaging substrate is provided. Before removing the substrate in the above-mentioned manufacturing process, the following steps are further included: first, apply a laser or a mechanical drill process on the insulation protective layer to form a plurality of openings in order to expose part of the build-up circuit as an external electrical connection pad.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
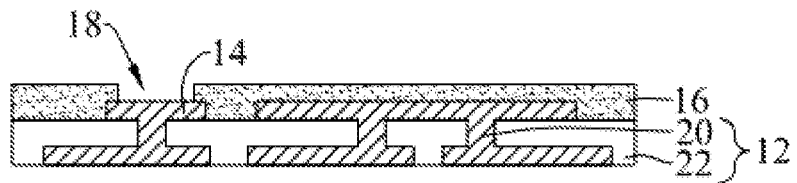
FIG. 1 shows the conventional fiducial marker structure with a solder mask opening.
Figure 2:
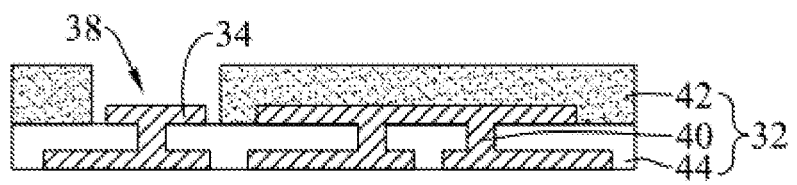
FIG. 2 shows the conventional fiducial marker structure with a mechanical opening.
Figure 3:
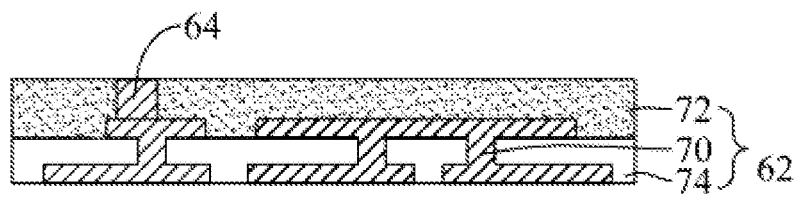
FIG. 3 shows the conventional fiducial marker structure with a copper pillar.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 4:
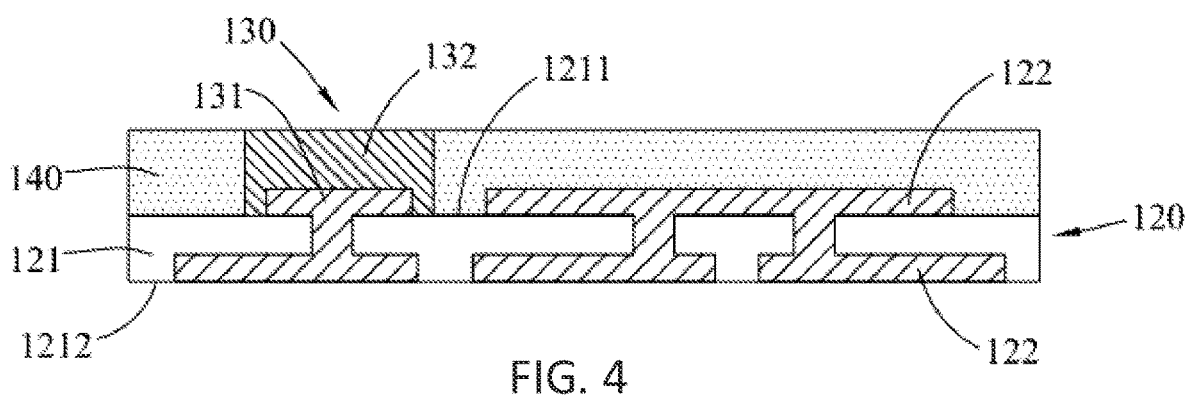
FIG. 4 is a schematic diagram of a semiconductor packaging substrate according to an embodiment of the present disclosure.

Please refer to FIG. 4, which is a schematic diagram of a semiconductor packaging substrate according to an embodiment of the present disclosure. It can be seen that the semiconductor packaging substrate 100 of the present disclosure includes a build-up circuit structure 120, at least one fiducial marker structure 130, and an insulating protective layer 140.

The build-up circuit structure 120 includes a first insulating layer 121 and a build-up circuit 122. The first insulating layer 121 has a first surface 1211 and a second surface 1212 opposite to each other. A part of the build-up circuit 122 is formed protruding on the first surface 1211 of the first insulating layer 121, a part of the build-up circuit 122 is embedded in the first insulating layer 121, and a part of the build-up circuit 122 is exposed on the second surface 1212 of the first insulating layer 121.

The fiducial marker structure 130 is disposed on the first surface 1211 of the first insulating layer 121. The fiducial marker structure 130 includes a fiducial marker 131 and a second insulating layer 132 which covers the fiducial marker 131. The composition of the fiducial marker 131 is a metallic material, and a part of the build-up circuit 122 can also be defined as the fiducial marker 131, and the composition of the second insulating layer 132 is a photosensitive transparent insulating material.

The insulating protective layer 140 is disposed on the first surface 1211 of the first insulating layer 121 to cover the fiducial marker structure 130, a part of the build-up circuit 122 and the surface 1211 of the first insulating layer 121. The top surface of the second insulating layer 132 of the fiducial marker structure 130 is exposed on the insulating protective layer 140.

Furthermore, the composition of the first insulating layer 121 is a film-like dielectric material with high filling material content or a dielectric material of a molding compound, and the build-up circuit 122 is disposed inside the first insulating layer 121 and on its surface. The build-up circuit 122 may include conductive pillars for connecting the build-up circuit 122 to each other, for example, to connect the build-up circuit 122 inside the first insulating layer 121 with that of which protruding from the first surface of the first insulating layer 121. The conductive pillars can be fabricated as metallic pillars, such as copper pillars.

In addition, the second insulating layer 132 is formed on the fiducial marker 131 by using a yellow light lithography process to completely cover the fiducial marker 131, and does not cover the other build-up circuit 122. The composition of the second insulating layer 132 is a photosensitive transparent dry film photoresist, a photosensitive transparent dielectric material, or other photosensitive transparent insulating materials. In addition, the shape of the fiducial marker 131 can be any geometric shape, including a round shape, a polygon, or a cross, etc., so that it can be seen and aligned by using a CCD (Charge Coupled Device; photosensitive coupling element) lens or a tool maker microscope (Tool Maker Microscope; a type of microscopes, which can be used as an optical instrument for two-dimensional coordinate size measurement).

Furthermore, the insulating protective layer 140 is composed of a film-like dielectric material with high filling material content or a dielectric material of a molding compound, which is disposed on the first insulating layer 121.

Figure 7:
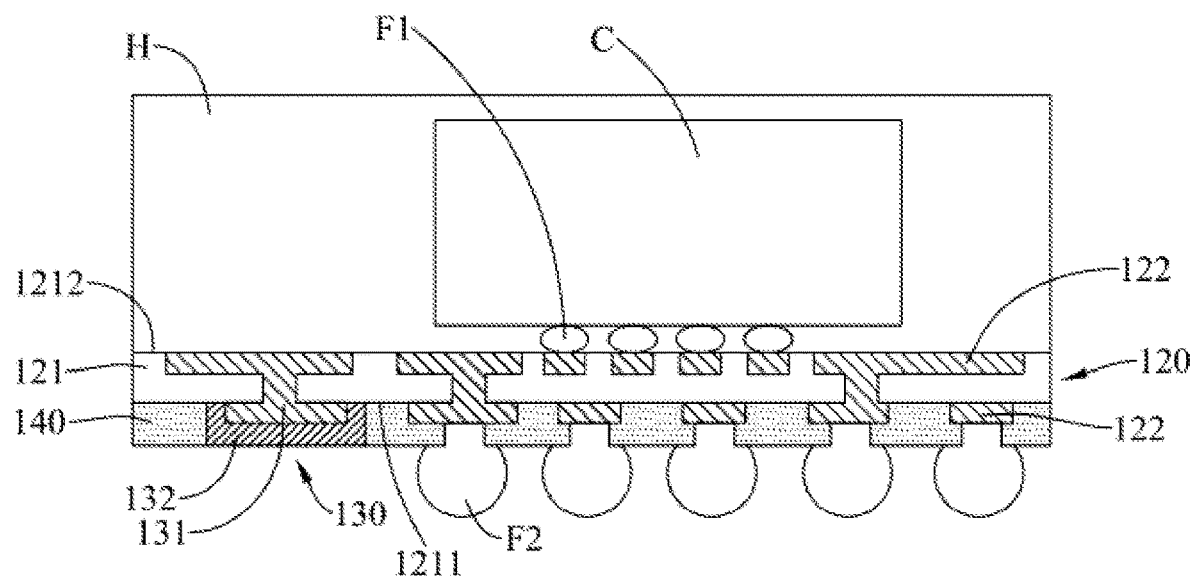
FIG. 7 is a schematic diagram of the present disclosure using a semiconductor packaging substrate to package chips according to an embodiment.

In another embodiment, the insulating protective layer 140 may also be provided with a plurality of openings to expose a portion of the build-up circuit 122 for external electrical connection pads (please refer to FIG. 7).

Figure 5:
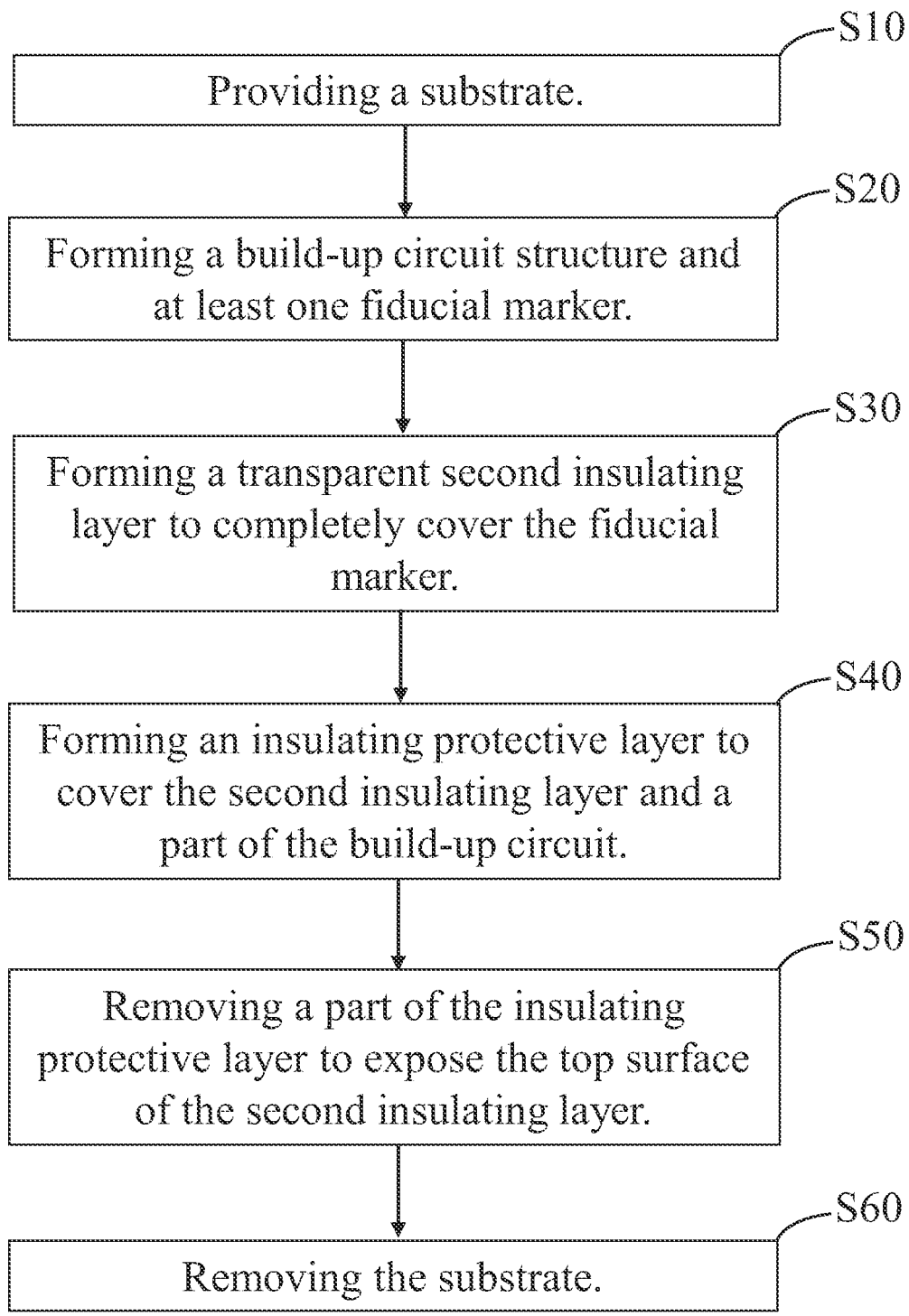
FIG. 5 is a flowchart of a method for manufacturing a semiconductor packaging substrate according to an embodiment of the present disclosure.
Figure 6A:
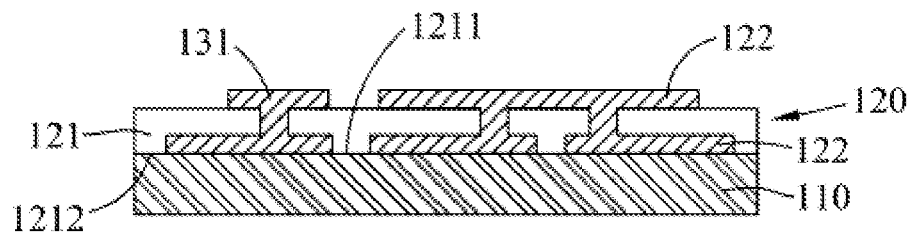
FIG. 6A to 6D are schematic diagrams of a method for manufacturing a semiconductor packaging substrate according to an embodiment of the present disclosure.

Please refer to FIG. 5, which is a schematic flowchart of a method for manufacturing a semiconductor packaging substrate according to an embodiment of the present disclosure, including the following process steps:

In the first step S10 (please refer to FIG. 6A), a substrate 110 is provided, the substrate 110 is a metallic substrate structure, so as to provide the functions of carrying and electroplating electrodes in subsequent process operations.

The second step S20 (please refer to FIG. 6A) is to form a build-up circuit structure 120 on the substrate 110 by a build-up process. The build-up circuit structure 120 includes a first insulating layer 121 and a build-up circuit 122. The first insulating layer 121 has a first surface 1211 and a second surface 1212 opposite to each other, and the second surface 1212 and the surface of the substrate 110 form a common surface. A part of the build-up circuit 122 is embedded in the first insulating layer 121, and another part of the build-up circuit 122 is formed protruding on the first surface 1211 of the first insulating layer 121. At least one fiducial marker 131 made of metallic material is simultaneously formed on the first surface 1211 of the first insulating layer 121 (the part of the build-up circuit 122 can also be defined as the fiducial marker 131).

Figure 6B:
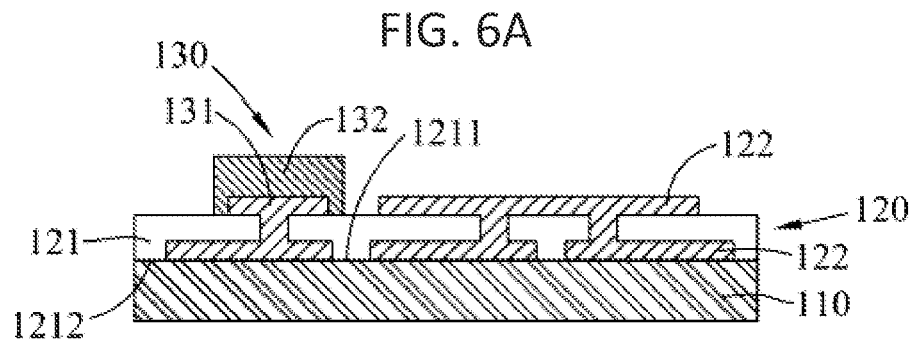

The third step S30 (please refer to FIG. 6B) is to form a photosensitive transparent second insulating layer 132 on the fiducial marker 131 by photolithography, so as to completely cover the fiducial marker 131.

Figure 6C:
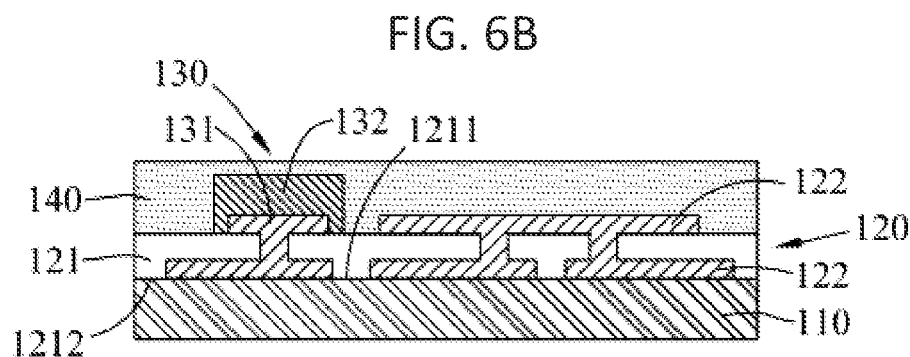

The fourth step S40 (please refer to FIG. 6C) is to form an insulating protective layer 140 on the first surface 1211 of the first insulating layer 121 to cover the second insulating layer 132, a part of the build-up circuit 122 and the first surface 1211 of the first insulating layer 121.

Figure 6D:
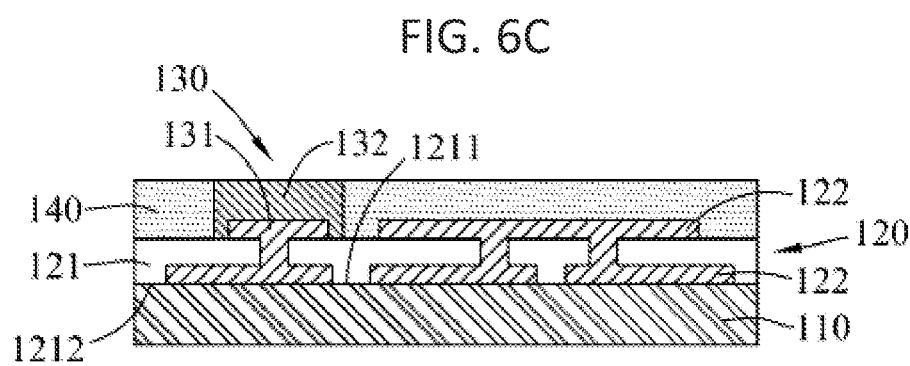

The fifth step S50 (please refer to FIG. 6D) is to remove a part of the insulating protective layer 140 to expose the top surface of the second insulating layer 132, and then, by using a CCD lens or a tool maker microscope, for example, the exposed surface of the second insulating layer 132 can be seen-through to align to the fiducial marker 131 within it.

Finally, in the sixth step S60, the substrate 110 is removed to expose the second surface 1212 of the first insulating layer 121 and a part of the surface of the build-up circuit 122.

Furthermore, the composition of the above-mentioned first insulating layer 121 is a film-like dielectric material with high filling material content or a dielectric material of molding compound. The composition of the second insulating layer 132 is a photosensitive transparent insulating material, or a photosensitive transparent dry film photoresist, or a photosensitive transparent dielectric material. The insulating protective layer 140 is composed of a film-like dielectric material with high filling material content or a dielectric material of molding compound. The first insulating layer 121 and the insulating protective layer 140 can be fabricated by an encapsulant molding technique, such as compression molding. Various contents or weight percentages of fillers, such as silicon dioxide (SiO2) or aluminum oxide (Al2O3), are added to the above-mentioned molding compounds. Taking the most commonly used epoxy molding compound (Epoxy Molding Compound, EMC) as an example, the main components and their weight percentages are: epoxy resin 12-15 wt %, hardener (Novolac Resin) 8-10 wt %, and filler (Silica filler) 70-90 wt %. The added inorganic powder filler is used to reduce the dielectric constant and dielectric loss coefficient of the packaging material.

Furthermore, the process of removing a part of the insulating protective layer 140 to expose the top surface of the second insulating layer 132 can be achieved by grinding, sandblasting, or plasma, etc. and any process that can be used to form a flat surface after removing the surface, so it is not limited by the above disclosure.

In another embodiment (please refer to FIG. 7), the method for manufacturing a semiconductor packaging substrate may further include the following steps before removing the substrate (i.e., before step S60): first applying a process such as a laser or a mechanical drill to make a plurality of openings on the insulating protective layer 140 in order to expose a part of the build-up circuit 122 as an external electrical connection pad for connecting and bonding solder balls F2.

In summary, the present disclosure has the following advantages:
1. The semiconductor packaging substrate of the present disclosure provides a specifically designed fiducial marker structure 130 which has a flat appearance and thus has no adverse effects on the packaging equipment or jigs.
2. The semiconductor packaging substrate of the present disclosure has a unique design of the fiducial marker structure 130 in which the metallic fiducial marker 131 is covered with the transparent second insulating layer 132. Which can prevent the fiducial marker 131 from problems occurring such as oxidizing or contaminating, with a view to ensure the efficiency and accuracy of identification and alignment by the CCD lens or tool maker microscope.
3. In the semiconductor packaging substrate of the present disclosure, the unique fiducial marker structure 130 is easy for making a small see-through area and for controlling the process parameters as well.
4. In the semiconductor packaging substrate of the present substrate, the unique fiducial marker structure 130 has a simplified manufacturing process, and there is no need for electroplating to manufacture the fiducial marker copper pillars 64, and thus the cost is relatively low.

The above description is exemplary only, not limiting. Any other equivalent modifications or changes without departing from the spirit and scope of the present disclosure should be included in the appended patent application scope.

What is claimed is:
1. A semiconductor packaging substrate, comprising:
   a build-up circuit structure comprising a first insulating layer and a build-up circuit, wherein the first insulating layer has a first surface and a second surface opposite to each other, and a part of the build-up circuit is formed protruding on the first surface of the first insulating layer, a part of the build-up circuit is embedded in the first insulating layer, and a part of the build-up circuit is exposed on the second surface of the first insulating layer;
   at least one fiducial marker structure disposed on the first surface of the first insulating layer, and comprising a fiducial marker and a second insulating layer covering the fiducial marker, and the fiducial marker protrudes from the first surface of the first insulating layer, wherein a composition of the fiducial marker is a metallic material, and a composition of the second insulating layer is a transparent insulating material; and
   an insulating protective layer disposed on the first surface of the first insulating layer, wherein the insulating protective layer covers the build-up circuit and the first surface of the first insulating layer, wherein the insulating protective layer does not cover the fiducial marker structure and a top surface of the second insulating layer of the fiducial marker structure is exposed on the insulating protective layer, whereby the fiducial marker is exposed on the insulating protective layer and is able to be detected by a charge coupled device lens.
2. The semiconductor packaging substrate as recited in claim 1, wherein the composition of the second insulating layer is a photosensitive transparent dry film photoresist, a photosensitive transparent dielectric material, or a photosensitive transparent insulating material.
3. The semiconductor packaging substrate as recited in claim 1, wherein a composition of the first insulating layer is a dielectric material with a high filling material content or a dielectric material of a molding compound.
4. The semiconductor packaging substrate as recited in claim 1, wherein a composition of the insulating protective layer is a dielectric material with a high filling material content, a dielectric material of a molding compound, or an insulating solder resist material.

5. The semiconductor packaging substrate as recited in claim 1, wherein the insulating protective layer is provided with a plurality of openings to expose a part of the build-up circuits as electrical connection pads.

6. A manufacturing method of a semiconductor packaging substrate comprising the following steps:
providing a substrate;
forming a build-up circuit structure, comprising a build-up circuit and a first insulating layer, on the substrate by a build-up method, wherein the first insulating layer has a first surface and a second surface opposite to each other, and the second surface and a surface of the substrate form a common plane, and a part of the build-up circuit is embedded in the first insulating layer, and a part of the build-up circuit is formed protruding on the first surface of the first insulating layer, and at least one fiducial marker made of a metallic material is simultaneously formed when the build-up circuit is formed on the first surface of the first insulating layer;
forming a transparent second insulating layer on the fiducial marker by a photolithography technology to completely cover the fiducial marker;
forming an insulating protective layer on the first surface of the first insulating layer to cover the second insulating layer, a part of the build-up circuit and the first surface of the first insulating layer;
removing a part of the insulating protective layer to expose a top surface of the second insulating layer; and
removing the substrate to expose the second surface of the first insulating layer and a part of the surface of the build-up circuit.

7. The method for manufacturing a semiconductor packaging substrate as recited in claim 6, wherein the second insulating layer is composed of a photosensitive transparent dry film photoresist, a photosensitive transparent dielectric material, or a photosensitive transparent insulating material.

8. The method for manufacturing a semiconductor packaging substrate as recited in claim 6, wherein a composition of the first insulating layer is a film-like dielectric material with high filling material content or a dielectric material of a molding compound.

9. The method for manufacturing a semiconductor packaging substrate as recited in claim 6, wherein a composition of the insulating protective layer is a film-like dielectric material with high filling material content or a dielectric material of a molding compound, or an insulating solder resist.

10. The method for manufacturing a semiconductor packaging substrate as recited in claim 6, further comprising that, before removing the substrate, use a process such as a laser or a mechanical drill to make a plurality of openings on the insulating protective layer in order to expose a part of the build-up circuit as an electrical connection pad.

\* \* \* \* \*